(12) United States Patent
Truong et al.

(10) Patent No.: US 10,068,776 B1
(45) Date of Patent: Sep. 4, 2018

(54) RASTER-PLANARIZED SUBSTRATE INTERLAYERS AND METHODS OF PLANARIZING SAME

(71) Applicant: Intel Corporation, Santa Clara, CA (US)

(72) Inventors: Frank Truong, Gilbert, AZ (US); Praneeth Akkinepally, Chandler, AZ (US); Shruti R. Jaywant, Chandler, AZ (US); Dilan Seneviratne, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/637,969

(22) Filed: Jun. 29, 2017

(51) Int. Cl.
| | | |
|---|---|---|
| *H01L 21/3105* | (2006.01) | |
| *H01L 21/312* | (2006.01) | |
| *H01L 21/4757* | (2006.01) | |
| *H01L 23/528* | (2006.01) | |
| *H01L 21/768* | (2006.01) | |
| *H01L 21/02* | (2006.01) | |

(52) U.S. Cl.
CPC .. *H01L 21/31053* (2013.01); *H01L 21/02354* (2013.01); *H01L 21/31058* (2013.01); *H01L 21/76805* (2013.01); *H01L 21/76819* (2013.01); *H01L 21/76885* (2013.01); *H01L 23/5283* (2013.01)

(58) Field of Classification Search
CPC ............... H01L 21/02354; H01L 21/31; H01L 21/31051; H01L 21/31053; H01L 21/31058; H01L 21/76819
See application file for complete search history.

(56) References Cited

U.S. PATENT DOCUMENTS

2001/0021594 A1* 9/2001 Yoo ................... H01L 21/76819
438/784

FOREIGN PATENT DOCUMENTS

JP        01015952 A  *  1/1989
KR     20010065308 A  *  7/2001

* cited by examiner

*Primary Examiner* — Robert Bachner
*Assistant Examiner* — Molly Reida
(74) *Attorney, Agent, or Firm* — Schwegman Lundberg & Woessner, P.A.

(57) ABSTRACT

An interlayer dielectric material includes a planar surface that exhibits planarity due to raster-patterned decomposition products due to use of a confocal light beam. The planar surface encompasses a filled via that is in electrical and physical contact with a bond pad that is also on the planar surface.

22 Claims, 8 Drawing Sheets

RASTER-PLANARIZED SUBSTRATE INTERLAYERS AND METHODS OF PLANARIZING SAME

FIELD

This disclosure relates to planarized substrate interlayer fabrication during package substrate manufacturing.

BACKGROUND

Semiconductor device miniaturization creates challenges during packaging as device size continually shrinks.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Organic substrates are more useful during fabrication when each added layer is substantially flat, within processing parameters, to provide a planar surface for assembling the subsequent layer. A package substrate for a semiconductor device is also planarized, and smaller dimensions call for increasing subsequent flat surfaces. Furthermore, with respect to assembling silicon die to the substrate, minimizing the bump height thickness variation of the substrate is useful for high yielding semiconductor devices. A contributor to the bump height thickness variation is the underlying thickness variation of the dielectric and copper layers, which can be minimized through the planarization process described in the disclosed embodiments.

Disclosed embodiments include planarization by directing a confocal light beam onto a photo-imagable dielectric layer at a defined target Z-height. The confocal light beam creates a useful light intensity at the confocal light-beam tip under conditions that alter the chemical bonds in the dielectric layer at the defined target Z-height. In an embodiment, laser light is directed into a confocal beam tip where the beam tip includes sufficient optical energy to alter chemical bonds.

A raster movement of the confocal light beam across the dielectric layer, creates a planar surface by removing undulations caused by incidental fabrication and underlying traces and bond pads. In an embodiment, the raster movement is modified by moving the confocal light-beam tip in an orbital pattern whilst moving the package substrate translationally in a single-dimension linear direction. Consequently, by the orbital-motion, linear-translational motion combination, the confocal light-beam tip covers the same area multiple times. In an embodiment, only one of the confocal light-beam tip and the package substrate is moved.

Figure 1A:
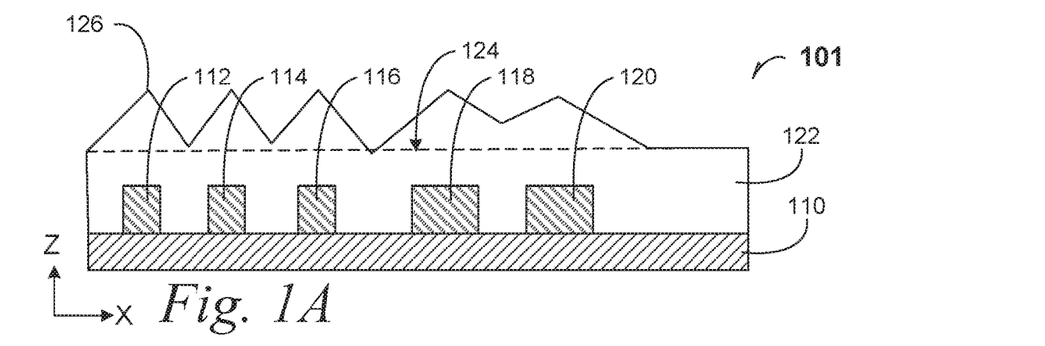
FIG. 1A is a cross-section elevation of a portion of a semiconductor device package substrate during processing according to an embodiment.

FIG. 1A is a cross-section elevation of a portion of a semiconductor device package substrate 101 during processing according to an embodiment. A first trace 110 is part of a larger package substrate during packaging-substrate fabrication, a section of which is highlighted with this drawing. The first trace 110 is in electrical contact with a second trace 112, a third trace 114, and a subsequent trace 116 in an embodiment. Whereas the first trace 110 is depicted running in the X-direction, the respective traces 112, 114 and 116 are depicted running orthogonal to the X-Z plane of the drawing. Additionally, a first contact pad 118 and a subsequent contact pad 120 are also disposed on and in electrical contact with the first trace 110 in an embodiment. In an embodiment, all depicted traces and contact pads are a copper metal composition that is useful for package-substrate wiring. In an embodiment, the first trace 110 is in electrical contact with fewer than all of the second, third and subsequent traces 112, 114 and 116, respectively.

A first interlayer dielectric (ILD) material 122 is depicted covering the several traces 110, 112, 114, 116 and the contact pads 118 and 120. In an embodiment, the first ILD material 122 is a positive-tone photosensitive material that is susceptible to decomposition when exposed to useful wavelengths of light.

In an embodiment, the first ILD material 122 exhibits a deviation from planarity as evidenced by a given target height 124 within the first ILD material 122, and a highest peak height 126 of the first ILD material 122. Although the highest peak height 126 is exhibited with a rectangular profile, it is understood that during dielectric material application, through processing such as, but not limited to, vacuum lamination, hot roll lamination, spin coating, slit coating, or spray coating, the first ILD material 122 will form several vertical irregularities that may be characterized as undulations when surface scanned or when viewed in vertical cross section.

Figure 1B:
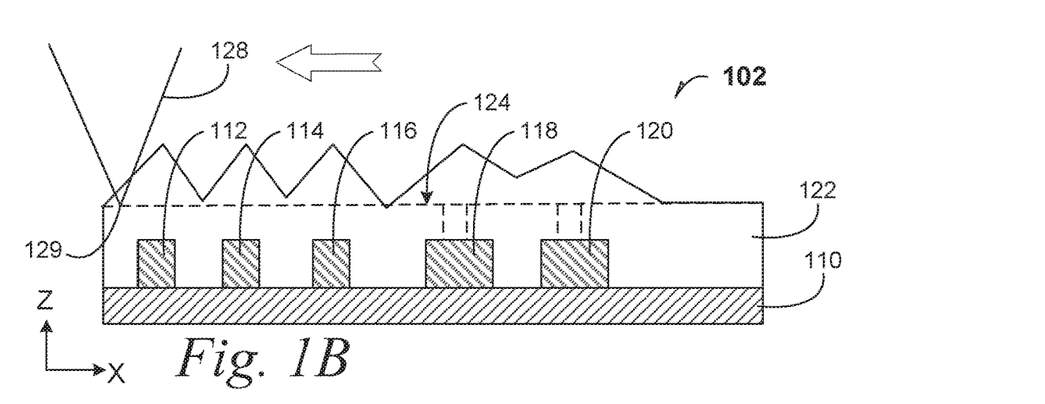
FIG. 1B is a cross-section elevation of the portion of the semiconductor device package substrate depicted in FIG. 1A after further processing according to an embodiment.

FIG. 1B is a cross-section elevation 102 of the portion of the semiconductor device package substrate 101 depicted in FIG. 1A after further processing according to an embodiment. In an embodiment, a confocal light beam 128 is directed to penetrate the irregularities, if any, in the first ILD material 122, and the confocal light beam 128 forms a maximum radiative focal tip 129 at the Z-direction location of the target height 124. The confocal light beam 128 is depicted moving from right-to-left as indicated by the accompanying directional arrow. As disclosed, only light at the focal tip 129 has sufficient intensity to alter chemical bonds within the first ILD material 122, sufficient that above and below the focal tip 129, the chemistry of the first ILD material 122 is substantially unchanged. In an embodiment, the confocal light beam 128 decomposes the first ILD material 122, only at the focal tip 129. Thereafter, removal of the first ILD material 122 is carried out as a fracture plane has been formed at the chemically altered planar pattern. At the target height 124, a chemically altered planar pattern resides within the first ILD material.

In an embodiment, several iterations of Z-height reduction is used where a confocal-beam fracture interface would otherwise be entirely hidden from a dissolving etch.

In an embodiment, the confocal light beam 128 has sufficient penetrating effectivity to render the incidental highest peak height 126 not too high for the focal tip 129 to penetrate and focus at the target height 124 within the first ILD material 122. In an embodiment, chemical bonds are altered and weakened within the first ILD material 122 at the target height 124, such that the first ILD material 122 will be cleaved at the target height 124 and a substantially flat upper surface will be presented, without the use of mechanical polishing or grinding operations. The substantially flat upper surface that forms at the target height 124 will minimize thickness variation across the substrate, enabling minimal photolithographic errors for a patterned metal layer that is formed after the first ILD material 122.

Figure 1C:
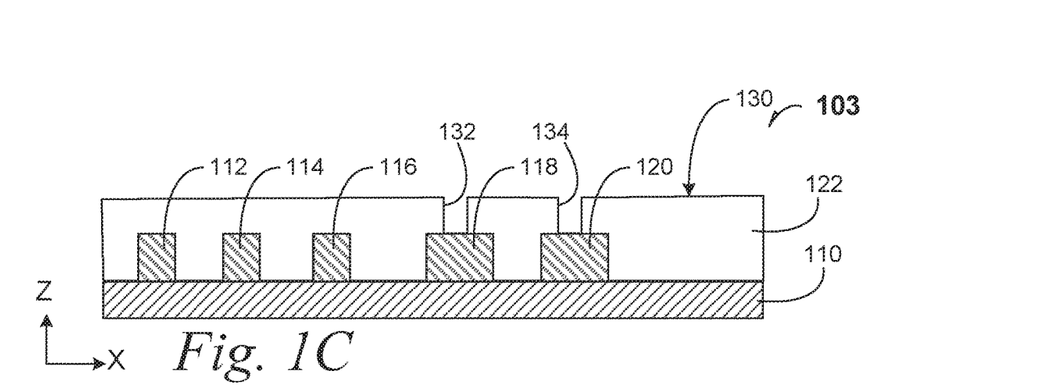
FIG. 1C is a cross-section elevation of the portion of the semiconductor device package substrate depicted in FIG. 1B after further processing according to an embodiment.

FIG. 1C is a cross-section elevation 103 of the portion of the semiconductor device package substrate 102 depicted in FIG. 1B after further processing according to an embodiment. After raster-processing the first ILD material 122, the target height 124, as depicted in FIG. 1B, is now the upper surface 130 of the first ILD material 122. Processing has included irradiating by using a confocal beam 128, developing the first ILD material 122, and removing ILD material that has been cleaved at the target height 124. In an embodiment, a wet etch is carried out that is selective to leaving unaltered portions of the first ILD material 122 but the wet etch attacks the altered chemistry of the first ILD material 122 at the target height 124.

Quantification of planarity is done by taking a critical dimension (CD) such as the X-direction width of the first trace 112, measuring a selected number of CDs across the upper surface 130, and allowing a fraction of the selected number of CDs to show Z-direction deviation. In an example quantification of planarity, the X-direction first trace 112 width is 2 micrometer (μm) and spacing between two traces, e.g., the first trace 112 and the second trace 114, is also 2 μm (called "2/2 spacing"). The selected number of CDs is taken as 10, which is called the nominal length. The Z-deviation from planarity at any point (e.g. highest point to lowest point) is $1/10^{th}$ of one CD. In other words, the Z-direction deviation from planarity cannot exceed $1/100^{th}$ of the nominal length as measured anywhere across the 10 CD nominal length. In an embodiment, the Z-direction deviation from planarity cannot exceed $1/50^{th}$ of the nominal length as measured anywhere across a given 10 CD nominal length. In an embodiment, the Z-direction deviation from planarity cannot exceed $1/20^{th}$ of the nominal length as measured anywhere across a given 10 CD nominal length.

In a processing embodiment, a first via 132 and a subsequent via 134 are also formed in the first ILD material 122 to open contact corridors to the first and subsequent bond pads 118 and 120, respectively. As illustrated in dashed lines in FIG. 1B, the confocal beam 128 creates contact corridors 132 and 134 between package substrate routing layers as seen in FIG. 1C.

In an embodiment where the confocal light processing is an alternative choice, for opening a via, patterning a mask may be done, followed by a directional etch to open a contact corridor such as the contact corridors 132 and 134. In an embodiment, via formation is performed by using laser drilling ($CO_2$, UV, excimer, etc.) or through dry etching processes such as plasma. By this process embodiment, the planarity of the upper surface 130 is not altered. Similarly in an embodiment with respect to the vias 432, 434, and 435 presented in FIG. 4, a temporary mask, followed by a directional etch is used, followed by a wet stripping of the temporary mask.

Figure 1D:
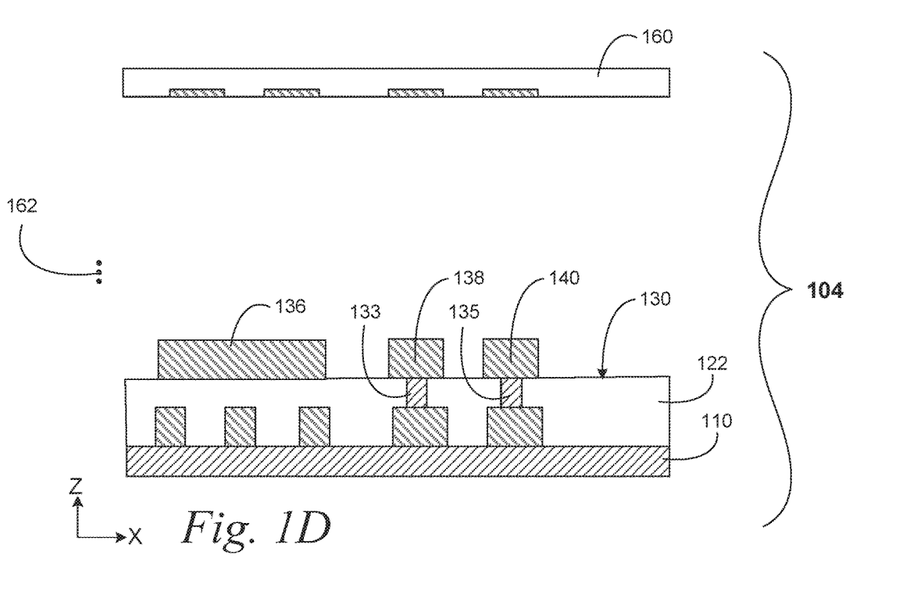
FIG. 1D is a cross-section elevation of the portion of the semiconductor device package substrate depicted in FIG. 1C after further processing according to an embodiment.

FIG. 1D is a cross-section elevation 104 of the portion of the semiconductor device package substrate 103 depicted in FIG. 1C after further processing according to an embodiment. A semi-additive process has been done to plate a first via 133 and a subsequent via 135 in the respective first and subsequent contact pad recesses 132 and 134 (see FIG. 1C). Further processing is done to form a plane 136, an upper first contact pad 138, and an upper subsequent contact pad 140. Where the routing layer that includes the plane, the upper first contact pad, and the upper subsequent contact pad 140 is to be further process in preparation for covering with an upper ILD material, further raster-planarizing may be done.

It may now be understood that a subsequent ILD material may be formed upon the upper surface 130 as well as over the contact pad 136 and the upper first and subsequent traces 138 and 140, and the raster-planarizing process may be repeated until a sufficiently flat upper surface is presented for yet another layer if needed.

In an embodiment, the first ILD material 122 is a final ILD layer before electrical bumping to mate with a semiconductive die 160 as part of a packaged semiconductive device 162. In this embodiment, the first trace 138 and the subsequent trace 140 may be I/O traces and the contact pad 136 may be an enlarged pad for power or ground communication to the semiconductive die.

Figure 2A:
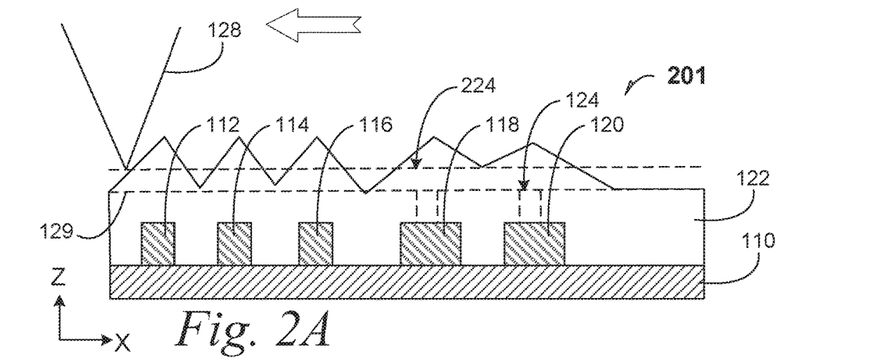
FIG. 2A is a cross-section elevation of a portion of a semiconductor device package substrate during processing according to an embodiment.

FIG. 2A is a cross-section elevation of a portion of a semiconductor device package substrate 201 during processing according to an embodiment. This embodiment includes an iterative raster-planarizing technique.

A first trace 110 is part of a larger package substrate during package substrate fabrication, a section of which is highlighted at this drawing. The first trace 110 is in electrical contact with a second trace 112, a third trace 114, and a subsequent trace 116. Whereas the first trace 110 is depicted running in the X-direction across the drawing, the respective traces 112, 114 and 116 are depicted running orthogonal to the X-Z plane of the drawing. Additionally, a first contact pad 118 and a subsequent contact pad 120 are also disposed on and in electrical contact with the first trace 110. In an embodiment, all depicted traces and contact pads are a copper metal composition that is useful for package-substrate wiring.

A first ILD material 122 is depicted covering the several traces 110, 112, 114, 116 and the contact pads 118 and 120. In an embodiment, the first ILD material 122 is a positive-tone photosensitive material that is susceptible to decomposition when exposed to useful wavelengths of light. In an embodiment, the first ILD material 122 exhibits a deviation from planarity as evidenced by a given target height 124 within the first ILD material 122, and a highest peak height 126 of the first ILD material 122.

Raster confocal beam decomposition may be seen by viewing a cross-section of a package substrate and noting a chemically altered layer at an interface surface of an ILD material, compared to the bulk middle of the ILD material. For example depending upon the definition of the beam tip, a partially decomposed portion of the ILD material will remain after removal at the sufficiently decomposed portion, and this layer is distinguishable from ILD material in the bulk middle of the ILD material. Such technique may be used such as scanning electron microscopy (SEM). Other techniques may be used where chemical signals alter during scanning microscopy. Although a given upper layer of an ILD material may have been partially decomposed by other techniques, it is sufficient to detect a partially altered chemistry.

In an embodiment, the confocal light beam 128 is directed to penetrate the irregularities, but an iterative technique is used by directing the confocal light beam 128 at an intermediate target level 224, to remove an intermediate first portion of the first ILD material 122 that is located vertically in the Z-direction above the intermediate target level 224 after removal of material to the first upper surface 225. It may now be understood that several intermediate target levels may be used to raster-planarize the first ILD material 122 by using a confocal light beam 128 that optimizes beam tip 129 intensity while addressing the ability of the confocal light beam 128 to effectively penetrate the first ILD material.

Figure 2B:
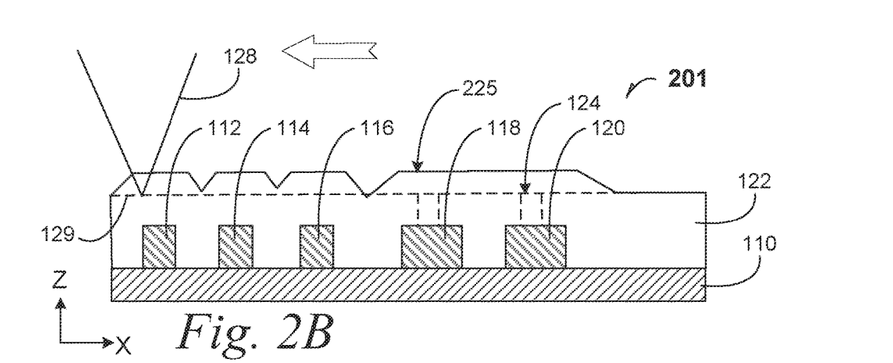
FIG. 2B is a cross-section elevation of the portion of the semiconductor device package substrate depicted in FIG. 2A after further processing according to an embodiment.

FIG. 2B is a cross-section elevation of the portion of the semiconductor device package substrate 201 depicted in FIG. 2A after further processing according to an embodiment. In an embodiment, the confocal light beam 128 is directed to penetrate the intermediate first upper surface 225 and remaining irregularities, if any, in the first ILD material 122, and the confocal light beam 128 forms a maximum radiative focal tip 129 at the Z-direction location of the target height 124.

In an embodiment, the iterative technique is done as necessary to reach the target height 124. For example, whereas an intermediate first portion of the first ILD material 122 has been removed as depicted in FIG. 1B, an intermediate subsequent portion of the first ILD material 122 is removed, which creates an intermediate subsequent upper surface that is located between the intermediate first upper surface 225 and the target height 124.

Figure 3A:
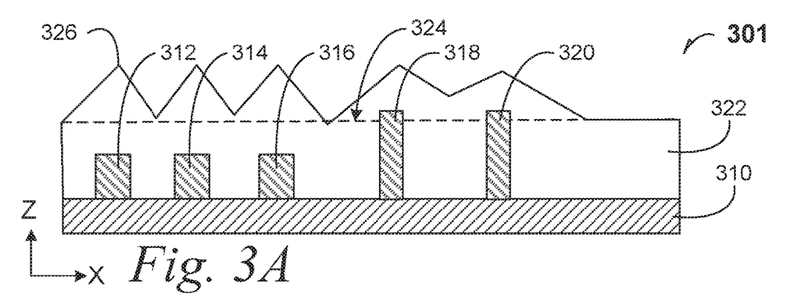
FIG. 3A is a cross-section elevation of a portion of a semiconductor device package substrate during processing according to an embodiment.

FIG. 3A is a cross-section elevation of a portion of a semiconductor device package substrate 301 during processing according to an embodiment. In an embodiment, a pillar 318, which will be used to make an via connection between two layers, is located with a Z-direction terminal end that is above a target height, but is below the undulating surface of the ILD first material. A confocal light imaging process is used to reveal the pillars as the imaging process receives optical feedback as it penetrates the ILD first material. In an embodiment, the conventional litho-via exploration (LiVE) technique is used, followed by the confocal light beam technique set forth in this disclosure.

A first trace 310 is part of a larger package substrate during packaging-substrate fabrication, a section of which is highlighted with this drawing. The first trace 310 is in electrical contact with a second trace 312, a third trace 314, and a subsequent trace 316. Whereas the first trace is depicted running in the X-direction across the drawing, the respective traces 312, 314 and 316 are depicted running orthogonal to the X-Z plane of the drawing. Additionally, a first pillar 318 and a subsequent pillar 320 are also disposed on and in electrical contact with the first trace 310. In an embodiment, all depicted traces and contact pads are a copper metal composition that is useful for package-substrate wiring.

A first ILD material 322 is depicted covering the several traces 310, 312, 314, 316 and the pillars 318 and 320. In an embodiment, the first ILD material 322 is a positive-tone photosensitive material that is susceptible to decomposition when exposed to useful wavelengths of light.

In an embodiment, the first ILD material 322 exhibits a deviation from planarity as evidenced by a given target height 324 within the first ILD material 322, and a highest peak height 326 of the first ILD material 322.

Although the highest peak height 326 is exhibited with a rectangular profile, it is understood that during processing such as through vacuum lamination, slit coating, spray coating, or hot roll lamination, the first ILD material 322 will form several vertical irregularities that may be characterized as undulations when surface scanned or when viewed in vertical cross section.

Figure 3B:
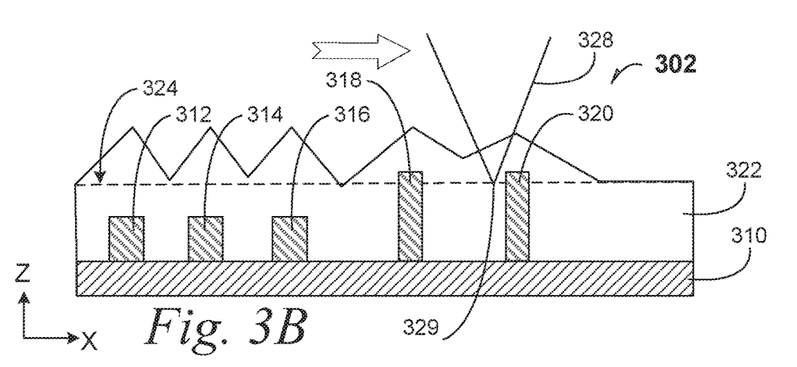
FIG. 3B is a cross-section elevation of the portion of a semiconductor device package substrate depicted in FIG. 3A after further processing according to an embodiment.

FIG. 3B is a cross-section elevation 302 of the portion of a semiconductor device package substrate 301 depicted in FIG. 3A after further processing according to an embodiment. In an embodiment, a confocal light beam 328 is directed to penetrate the irregularities, if any, in the first ILD material 322, and the confocal light beam 328 forms a maximum radiative focal tip 329 at the Z-direction location of the target height 324. The confocal light beam 328 is depicted moving from left-to-right as indicated by the accompanying directional arrow. Where the focal tip 329 encounters opaque obstructions such as the respective first and second pillars 318 and 320, the LiVE technique has mapped out the contours of the pillars 318 and 320 to chemically alter the first ILD material 322 at the pillar contours.

In an embodiment, the confocal light beam 328 has sufficient penetrating effectivity to render the incidental highest peak height 326 irrelevant for the tip 329 to penetrate and focus at the target height 324 within the first ILD material 322. In an embodiment, chemical bonds are altered and weakened within the first ILD material 322 at the target height 324, such that the first ILD material 322 will be cleaved at the target height 324 and a substantially flat upper surface is presented with the pillars 318 and 320 protruding above the target height 324, without the use of mechanical polishing or grinding operations. The substantially flat upper surface that forms at the target height 324 minimizes photolithographic errors for an ILD material that is formed after the first ILD material 322.

Figure 3C:
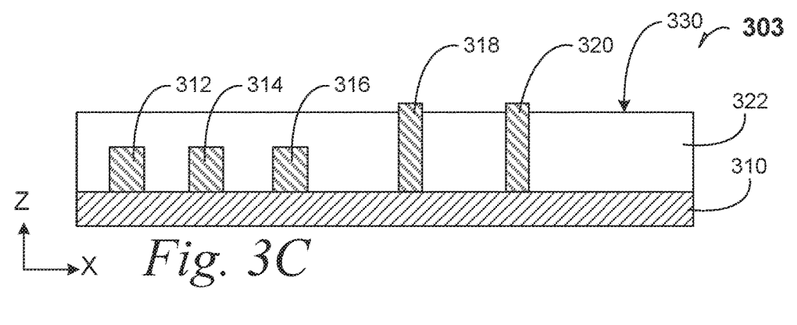
FIG. 3C is a cross-section elevation of the portion of the semiconductor device package substrate depicted in FIG. 3B after further processing according to an embodiment.

FIG. 3C is a cross-section elevation 303 of the portion of the semiconductor device package substrate 302 depicted in FIG. 3B after further processing according to an embodiment. Processing has included confocal light-beam alteration of the ILD material 322, developing the ILD material 322, and removal of ILD material above the planar surface formed by the confocal beam. The upper surface 330 exhibits a useful planarity as defined herein, and the first and subsequent pillars 318 and 320 protrude above the upper surface 330.

In an embodiment, an iterative technique is used to reach the upper surface 330 as set forth in the technique described with respect to FIG. 2B.

Figure 3D:
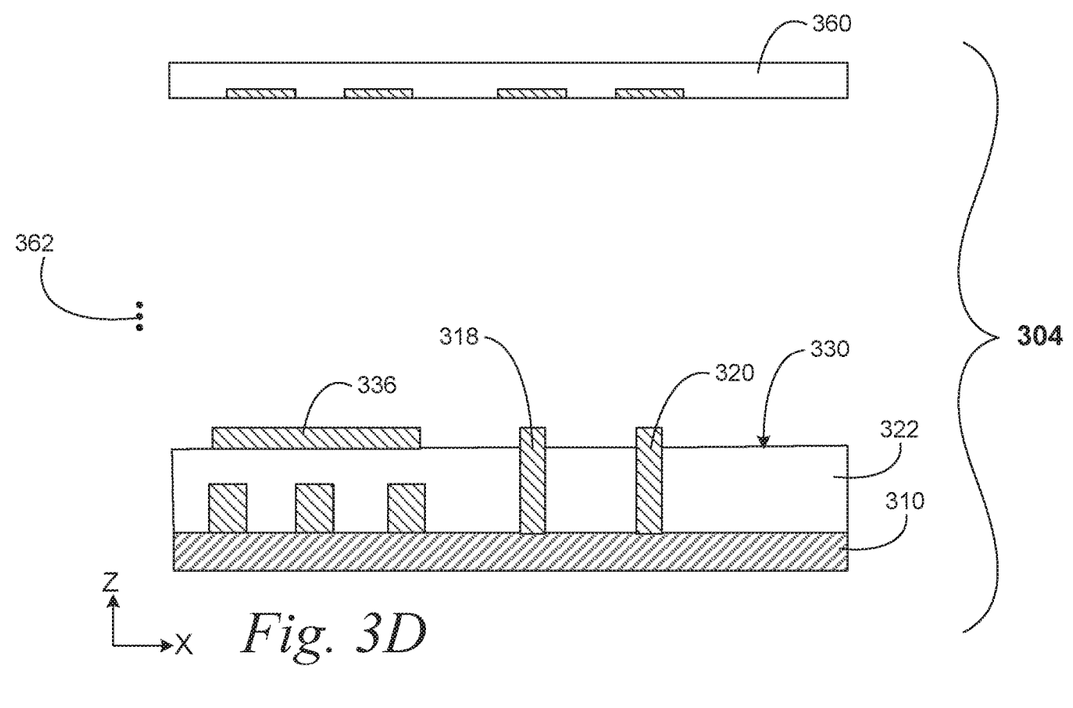
FIG. 3D is a cross-section elevation of the portion of the semiconductor device package substrate depicted in FIG. 3C after further processing according to an embodiment.

FIG. 3D is a cross-section elevation 304 of the portion of the semiconductor device package substrate 303 depicted in FIG. 3C after further processing according to an embodiment. A plating process has been done to plate contact pad 336 that extends to about the same Z-height as the first and subsequent pillars 318 and 320.

It may now be understood that a subsequent ILD material may be formed upon the upper surface 330 as well as over the contact pad 336 and the pillars 318 and 320.

In an embodiment, the first ILD material 322 is a final ILD layer before electrical bumping to mate with a semiconductive die 360 as part of a packaged semiconductive device 362.

Figure 4:
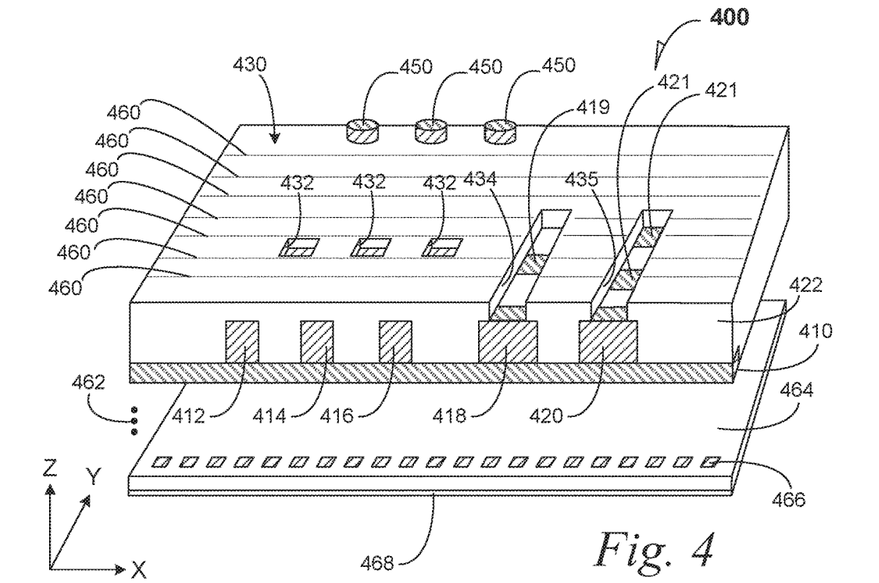
FIG. 4 is a perspective elevation of a portion of a semiconductor device package substrate during processing according to an embodiment.

FIG. 4 is a perspective elevation of a portion of a semiconductor device package substrate 400 during processing according to an embodiment. A first trace 410 is part of a larger package substrate during packaging-substrate fabrication, a section of which is highlighted with this drawing. The first trace 410 is in electrical contact with a second trace 412, a third trace 414, and a subsequent trace 416 in an embodiment. Whereas the first trace 410 is depicted running in the X-direction, the respective traces 412, 414 and 416 are depicted running orthogonal to the X-Z plane of the drawing. Additionally, a first contact pad 418 and a subsequent contact pad 420 are also disposed on and in electrical contact with the first trace 410. Further, a series of pillars 450 are depicted emerging from an upper surface 430 of a first ILD material 422. In an embodiment, the pillar 450 is a contact pillar as it contacts a trace at the Z-direction location of the first trace 410, and it is prepared to electrically and physically contact other metal structures where it emerges through the planar surface 430. In an embodiment, all depicted traces, contact pads and pillars are a copper metal composition that is useful for package-substrate wiring.

Processing is depicted where a confocal light beam has raster-planarized the upper surface 430 as disclosed herein. In an embodiment, raster-planarizing striations 460 may be observed below the non-planarity threshold such that the upper surface 430 is effectively planar with respect to photolithographic and topology errors that are obviated according to this disclosure. In an embodiment, the striations 460 are detected by such analytical tools as FTIR detection or LiVE detection, or wave front detection. Additionally, the striations 460 are detected when viewed in cross section, albeit the striations 460 remain below the non-planarity threshold.

In an embodiment, the confocal light beam has opened recesses 432, 434 and 435. The recesses 432 may be incidental contact corridors that will be via filled during the next level of processing such as by semi-additive processing (SAP). The recesses 434 and 435 are depicted as open channels that run in the Y-direction and that open the upper surface 430 along the channels. The respective first and subsequent contact pads 418 and 420 are seen at cross-section, and further contact pads 419 and 421 are also seen being exposed within the channels 434 and 435. It can be seen that similar to the first via 133 depicted in FIG. 1C, the trench recess 434 can be filled with a trace also by semi-additive plating processes (not depicted), and the trace makes physical and electrical contact with the first bond pad 418 and at least one other bond pad 419. The trace allows for lateral routing from the first trace 410 to other regions within the first ILD material 422.

In an embodiment, the first ILD material 422 is part of a completed package substrate 462, and the package substrate is mounted onto a board 464, such as a printed wiring board including a ball-grid array 466. In an embodiment, the board 464 includes an external surface 468 that acts as a shell 468 for a complete computing system. Further computing system embodiments are disclosed with respect to FIG. 6.

In an embodiment, the planar surface 430 is the final upper surface that creates a mounting surface for a semiconductor device such as a processor die. In an embodiment, the recesses 432 are present and are part of a contact-corridor array that accepts filled vias, such as the filled vias 133 and 135 depicted in FIG. 1D, as well as bond pads such as the bond pads 138 and 140. This structure creates bond pads for a ball-grid array or for a land-grid array to accept a flip-chip semiconductor device such as a processor die.

Figure 5:
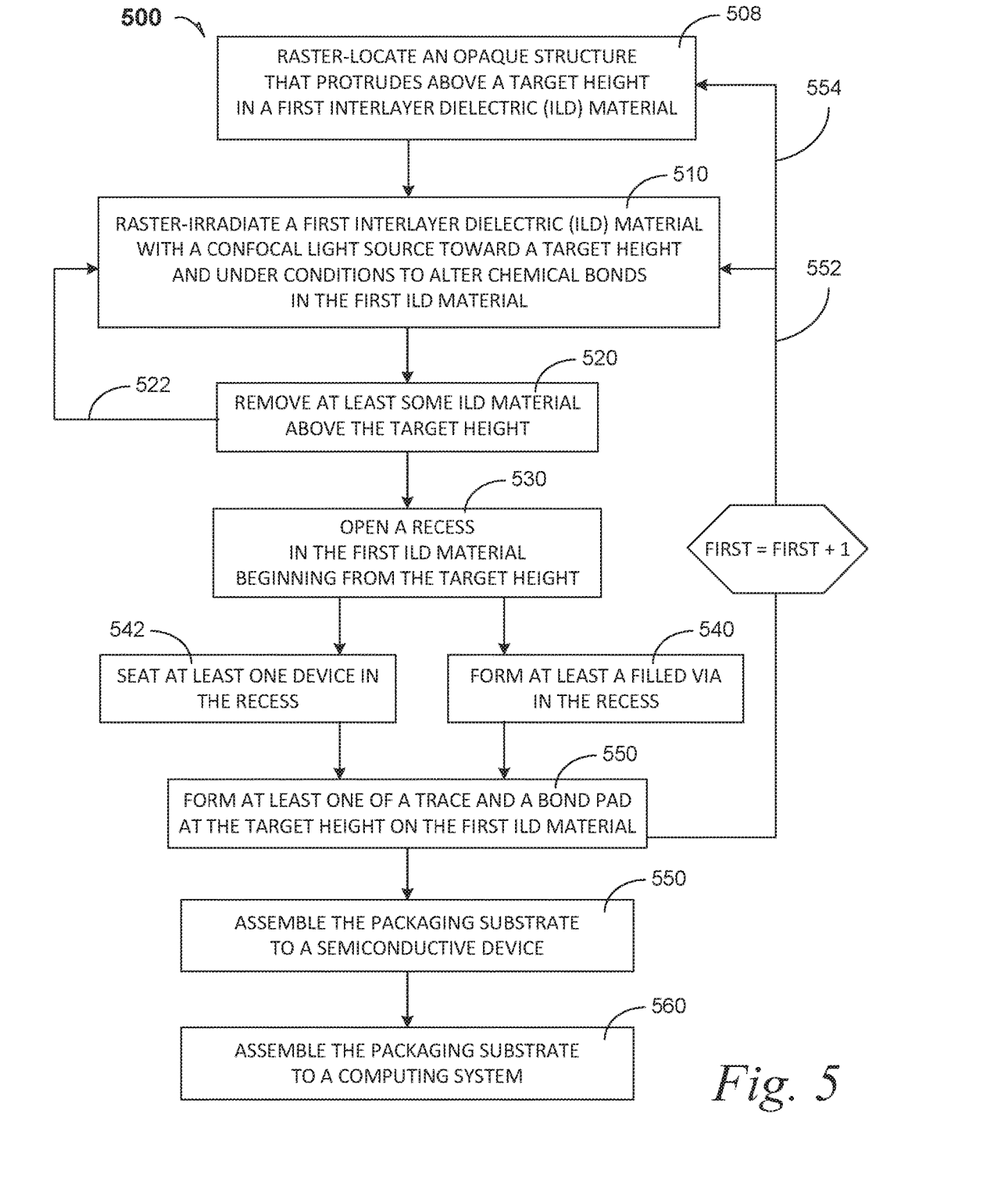
FIG. 5 is a process flow diagram according to several embodiments.

FIG. 5 is a process flow diagram 500 according to several embodiments.

At 508, a pillar-locating technique is used by raster-locating an opaque structure within the ILD material that protrudes above a given target height.

At 510, the process includes raster-irradiating a first ILD material with a confocal light source, toward a target height and under conditions to alter chemical bonds in the first ILD material.

At 520, the process includes removing at least some ILD material that is above the target height.

At 522, the process at 510 is repeated where an iterative raster-irradiation with a confocal beam is useful, followed by removal of the next iteration of ILD material that is above the confocal light beam tip. In an iterative processing technique, partial and superficial development of the ILD material is useful.

At 530, the process includes opening a recess in the first ILD material beginning from the target height.

At 540, the process includes forming at least a filled via in the recess. The filled via may also be part of a filled trench that results in a trace at the target height.

At 542, a parallel process with the process described at 540, may include seating at least one device in the recess. The at least one device is described with respect to FIG. 7.

At 550, the process includes forming at least one of a trace and a bond pad at the target height on the first ILD material.

At 560, the process includes assembling the package substrate to a semiconductor device. The process may next branch to forming a next ILD material on the planar surface. Processing is mapped by incrementing "first ILD material" by one.

At 570, the process includes assembling the package substrate to a computing system. Computing system embodiments are further described with respect to FIG. 6.

Figure 6:
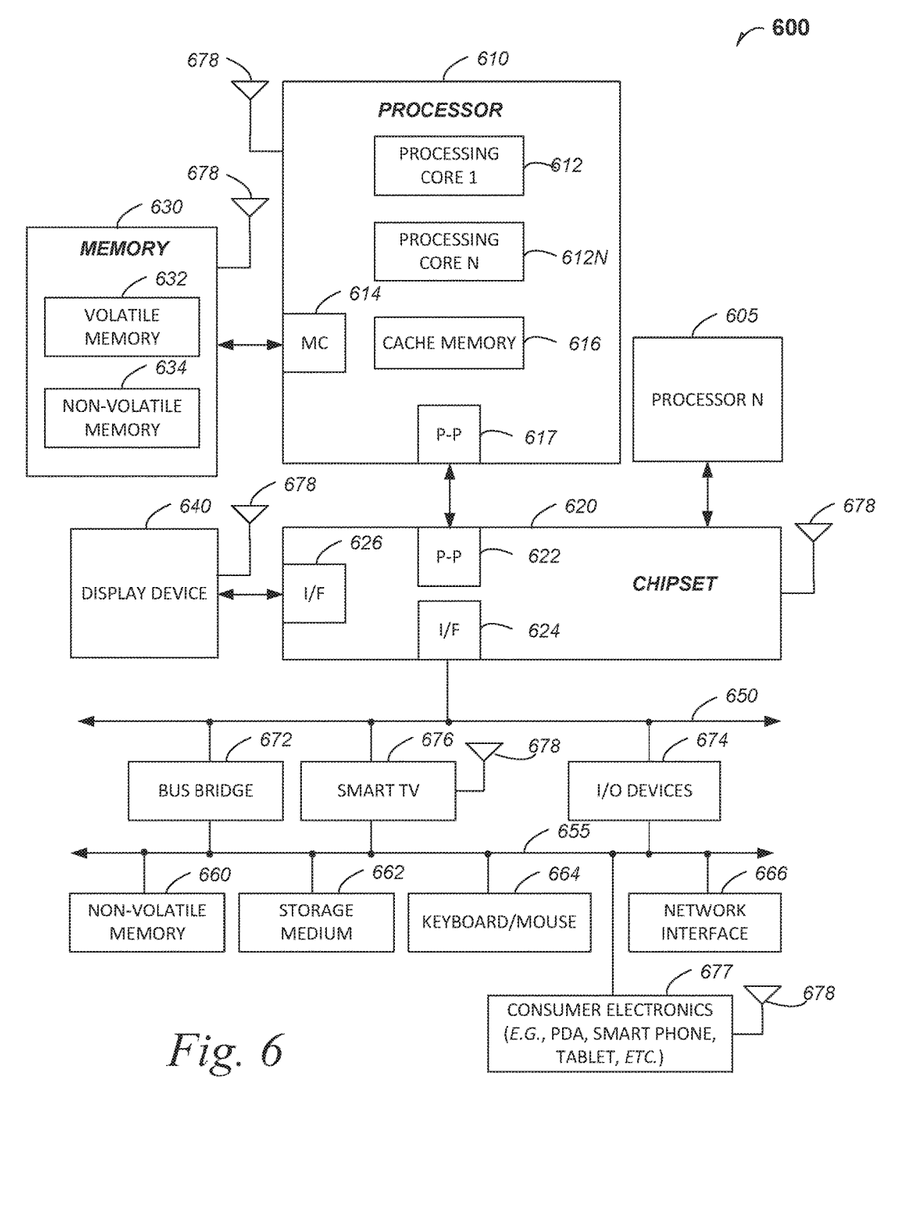
FIG. 6 is included to show an example of a higher level device application for the disclosed embodiments.

FIG. 6 is included to show an example of a higher level device application for the disclosed embodiments. The package substrate embodiments may be found in several parts of a computing system. In an embodiment, a computing system 600 includes, but is not limited to, a desktop computer. In an embodiment, a system 600 includes, but is not limited to a laptop computer. In an embodiment, a system 600 includes, but is not limited to a netbook. In an embodiment, a system 600 includes, but is not limited to a tablet. In an embodiment, a system 600 includes, but is not limited to a notebook computer. In an embodiment, a system 600 includes, but is not limited to a personal digital assistant (PDA). In an embodiment, a system 600 includes, but is not limited to a server. In an embodiment, a system 600 includes, but is not limited to a workstation. In an embodiment, a system 600 includes, but is not limited to a cellular telephone. In an embodiment, a system 600 includes, but is not limited to a mobile computing device. In an embodiment, a system 600 includes, but is not limited to a smart phone. In an embodiment, a system 600 includes, but is not limited to an internet appliance. In an embodiment, the packaging substrate is part of a wearable computing system. Other types of computing device may be configured with the microelectronic device that includes planar-substrate embodiments.

In an embodiment, the processor 610 has one or more processing cores 612 and 612N, where 612N represents the Nth processor core inside processor 610 where N is a positive integer. In an embodiment, the electronic device system 600 using a planar package-substrate embodiment that includes multiple processors including 610 and 605, where the processor 605 has logic similar or identical to the logic of the processor 610. In an embodiment, the processing core 612 includes, but is not limited to, pre-fetch logic to fetch instructions, decode logic to decode the instructions, execution logic to execute instructions and the like. In an embodiment, the processor 610 has a cache memory 616 to cache at least one of instructions and data for the planar package-substrate apparatus in the system 600. The cache memory 616 may be organized into a hierarchal structure including one or more levels of cache memory.

In an embodiment, the processor 610 includes a memory controller 614, which is operable to perform functions that enable the processor 610 to access and communicate with memory 630 that includes at least one of a volatile memory 632 and a non-volatile memory 634. In an embodiment, the processor 610 is coupled with memory 630 and chipset 620. The processor 610 may also be coupled to a wireless antenna 678 to communicate with any device configured to at least one of transmit and receive wireless signals. In an embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), or any other type of non-volatile memory device.

The memory 630 stores information and instructions to be executed by the processor 610. In an embodiment, the memory 630 may also store temporary variables or other intermediate information while the processor 610 is executing instructions. In the illustrated embodiment, the chipset 620 connects with processor 610 via Point-to-Point (PtP or P-P) interfaces 617 and 622. Either of these PtP embodiments may be achieved using a package substrate embodiment as set forth in this disclosure. The chipset 620 enables the processor 610 to connect to other elements in the package substrate embodiments in a system 600. In an embodiment, interfaces 617 and 622 operate in accordance with a PtP communication protocol such as the Intel® QuickPath Interconnect (QPI) or the like. In other embodiments, a different interconnect may be used.

In an embodiment, the chipset 620 is operable to communicate with the processor 610, 605N, the display device 640, and other devices 672, 676, 674, 660, 662, 664, 666, 677, etc. The chipset 620 may also be coupled to a wireless antenna 678 to communicate with any device configured to at least do one of transmit and receive wireless signals.

The chipset 620 connects to the display device 640 via the interface 626. The display 640 may be, for example, a liquid crystal display (LCD), a plasma display, cathode ray tube (CRT) display, or any other form of visual display device. In and embodiment, the processor 610 and the chipset 620 are merged into a planar package-substrate apparatus in a system. Additionally, the chipset 620 connects to one or more buses 650 and 655 that interconnect various elements 674, 660, 662, 664, and 666. Buses 650 and 655 may be interconnected together via a bus bridge 672 such as at least one planar package-substrate embodiment. In an embodiment, the chipset 620 couples with a non-volatile memory 660, a mass storage device(s) 662, a keyboard/mouse 664, and a network interface 666 by way of at least one of the interface 624 and 674, the smart TV 676, and the consumer electronics 677, etc.

In and embodiment, the mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the package substrate embodiment in a computing system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into the processor core 612.

Where useful, the computing system 600 may have an outer shell. Referring to FIG. 4, when the first ILD material 422 is part of a complete package substrate 462 and it is mounted onto a board 464 such as a board with a ball-grid array 466, the package substrate 462 is protected by a shell 468 that both electrically and physical insulated useful structures set forth in this disclosure. In an embodiment, the package substrate 464 includes the outer shell 468 that is an electrically insulated structure that also provides physical protection for the planarized ILD package-substrate embodiment.

Figure 7:
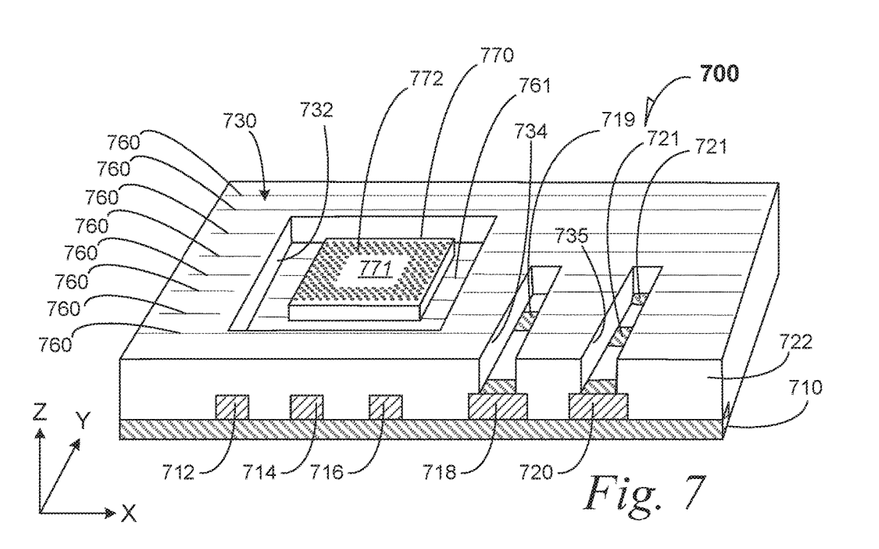
FIG. 7 is a perspective elevation of a portion of a semiconductor device package substrate during processing according to an embodiment.

FIG. 7 is a perspective elevation of a portion of a semiconductor device package substrate 700 during processing according to an embodiment. In this embodiment, a recess is opened by the raster-planarizing technique, large enough to accommodate a recess-seated device.

A first trace 710 is part of a larger package substrate during packaging-substrate fabrication, a section of which is highlighted with this drawing. The first trace 710 is in electrical contact with a second trace 712, a third trace 714, and a subsequent trace 716. Whereas the first trace 710 is depicted running in the X-direction, the respective traces 712, 714 and 716 are depicted running orthogonal to the X-Z plane of the drawing. Additionally, a first contact pad 718 and a subsequent contact pad 720 are also disposed on and in electrical contact with the first trace 710. In an embodiment, all depicted traces and contact pads are a copper metal composition that is useful for package-substrate wiring.

Processing is depicted where a confocal light beam has raster-planarized the upper surface 730 as disclosed herein. In an embodiment, raster-planarizing striations 760 may be observed below the non-planarity threshold such that the upper surface 730 is effectively planar with respect to photolithographic and topology errors that are obviated according to this disclosure.

In an embodiment, the confocal light beam has opened recesses 732, 734 and 735. The recesses 732 is sufficiently large to accommodate a device 770. Raster striations are also seen in the recess 732, one raster striation of which is indicated with reference number 761.

In an embodiment, the device 770 is a passive device such as a capacitor. In an embodiment, the device 770 is a passive device such as an inductor. In an embodiment, the device 770 is a passive device such as a resistor. In an embodiment, the device 770 has an upper surface 771 that is at effectively the same Z-height as the first upper surface 730. In an embodiment, the device 770 is an active device such as a memory chip. In an embodiment, the device 770 is a baseband device. In an embodiment, the device 770 is a transceiver. In an embodiment, the device is a memory-controller hub. In an embodiment, the device 770 is one of several devices that are inserted in the recess 732. In this embodiment, the device 770 is smaller than depicted. In an embodiment, the device 770 has a ball-grid array 772 that allows for face-to-face coupling with another device.

In an embodiment, the recesses 734 and 735 may be incidental contact corridors that will be via filled during the next level of processing. The recesses 734 and 735 are depicted as open channels that runs in the Y-direction and that open the upper surface 730 along the channels. The respective first and subsequent contact pads 718 and 720 are seen at cross-section, and further contact pads 719 and 721 are also seen being exposed within the channels 734 and 735.

In a processing embodiment, the recess 732 has a different depth than any of the channels 734 and 735. Raster-planarizing to open recesses is iteratively done until the shallower of a plurality of recess has reached its useful depth. Thereafter, raster-planarizing in the remaining recess(es) is continued.

To illustrate the raster-planarized package substrate embodiments and methods disclosed herein, a non-limiting list of examples is provided herein:

Example 1 is a semiconductor package structure, comprising: at least one trace dispose within a first interlayer dielectric (ILD) material, wherein the at least one trace is in electrical contact with a second trace, and wherein the first ILD material contacts the at least one and second trace; wherein the first ILD material includes a planar surface that exhibits raster confocal beam decomposition of the first ILD material at the planar surface.

In Example 2, the subject matter of Example 1 optionally includes a filled via that communicates through the planar surface; and a bond pad disposed upon the planar surface in physical and electrical contact with the filled via.

In Example 3, the subject matter of any one or more of Examples 1-2 optionally include a contact pillar that emerges from the planar surface, wherein the contact pillar is partially embedded in the first ILD material.

In Example 4, the subject matter of any one or more of Examples 1-3 optionally include a recess in the planar surface and a device seated in the recess, wherein the device has an upper surface that is coplanar with the planar surface.

In Example 5, the subject matter of any one or more of Examples 1-4 optionally include a recess in the planar surface and a device seated in the recess, wherein the device is selected from an active device and a passive device.

In Example 6, the subject matter of any one or more of Examples 1-5 optionally include a contact pillar that emerges from the planar surface, wherein the contact pillar is partially embedded in the first ILD material; a filled via that communicates through the planar surface; a bond pad disposed upon the planar surface in physical and electrical contact with the filled via; and a recess in the planar surface and a device seated in the recess, wherein the device has an upper surface that is coplanar with the planar surface.

In Example 7, the subject matter of any one or more of Examples 1-6 optionally include a trench in the first ILD material that opens the upper surface, wherein the trench is filled with a trace, and wherein the trace makes physical and electrical contact with the first bond pad and at least one other bond pad.

In Example 8, the subject matter of any one or more of Examples 1-7 optionally include a filled via that communicates through the planar surface; a bond pad disposed upon the planar surface in physical and electrical contact with the filled via; and a semiconductor die disposed on the planar surface and in electrical contact with the bond pad; and a board disposed below the first trace, wherein the first ILD material and first trace are part of a semiconductor die package, and wherein the board includes an array selected from a land-grid array and a ball-grid array for mounting the semiconductor die package.

Example 9 is a method of planarizing an interlayer dielectric (ILD) material of a package substrate, comprising: irradiating the ILD material with a confocal light source, wherein the confocal light source forms a focal tip, wherein irradiating is under conditions to cause the focal tip to penetrate at least some of the ILD material, and wherein irradiating is under conditions to change chemical bonds within the ILD material where the focal tip is formed; and moving the confocal light source across the ILD material until a chemically altered planar pattern is formed in the ILD material; and removing a portion of the ILD material at the chemically altered planar pattern to leave a planar surface.

In Example 10, the subject matter of Example 9 optionally includes after the chemically altered planar pattern is formed, developing the first ILD material under conditions to cause a fracture plane at the chemically altered planar pattern.

In Example 11, the subject matter of any one or more of Examples 9-10 optionally include wherein moving the confocal light source includes raster-irradiating the ILD material.

In Example 12, the subject matter of any one or more of Examples 9-11 optionally include wherein moving the confocal light source includes orbital-motion irradiating the ILD material, whilst moving the ILD material in a linear-translational motion.

In Example 13, the subject matter of any one or more of Examples 9-12 optionally include wherein forming the chemically altered planar pattern is achieved above a target height, the method further including: repeating irradiating the ILD material at a different height and under conditions to change chemical bonds in a subsequent level of the ILD material; moving the confocal light source across the ILD material until a subsequent chemically altered planar pattern is formed in the ILD material; and removing a portion of the ILD at the subsequent chemically altered planar pattern.

In Example 14, the subject matter of any one or more of Examples 9-13 optionally include opening a recess in the first ILD material, beginning at a target height that has been achieved by the chemically altered planar pattern.

In Example 15, the subject matter of any one or more of Examples 9-14 optionally include opening a recess in the first ILD material, beginning at a target height that has been achieved by the chemically altered planar pattern, wherein opening the recess creates a contact corridor within the first ILD material; and forming a filled via in the recess.

In Example 16, the subject matter of any one or more of Examples 9-15 optionally include opening a recess in the first ILD material, beginning at a target height that has been achieved by the chemically altered planar pattern, wherein opening the recess creates a contact corridor within the first ILD material; forming a filled via in the recess; and forming a bond pad in contact with the filled via, wherein the bond pad is disposed on the planar surface.

In Example 17, the subject matter of any one or more of Examples 9-16 optionally include opening a recess in the first ILD material, beginning at a target height that has been achieved by the chemically altered planar pattern, wherein opening the recess creates a trace trench within the first ILD material; and forming a trace in the trace trench.

In Example 18, the subject matter of any one or more of Examples 9-17 optionally include opening a recess in the first ILD material, beginning at a target height that has been achieved by the chemically altered planar pattern, wherein opening the recess creates a device seat within the first ILD material; and seating a device within the device seat.

In Example 19, the subject matter of any one or more of Examples 9-18 optionally include opening a contact-corridor recess in the first ILD material, beginning at a target height that has been achieved by the chemically altered planar pattern; forming a filled via in the contact-corridor recess; and opening a device-seat recess in the first ILD material, beginning at a target height that has been achieved by the chemically altered planar pattern; and seating a device within the device seat.

Example 20 is a computing system, comprising: a semiconductor die disposed on a planar surface of a first interlayer dielectric (ILD) material; at least one trace dispose within the first ILD material, wherein the at least one trace is in electrical contact with a second trace, and wherein the first ILD material contacts the at least one and second trace; wherein the first ILD material planar surface exhibits raster confocal beam decomposition of the first ILD material at the planar surface; a filled via that communicates through the planar surface; a bond pad disposed upon the planar surface in physical and electrical contact with the filled via, wherein the bond pad is part of a land-grid array for the semiconductor die; a trench in the first ILD material that opens the planar surface, wherein the trench is filled with a trace, and wherein the trace makes physical and electrical contact with the first bond pad and at least one other bond pad; and wherein the first ILD material is part of a package substrate, and further including a board onto which the package substrate is disposed, wherein the board includes a ball-grid array on one surface and a physical and electrically insulative shell on a surface opposite the ball-grid array.

In Example 21, the subject matter of Example 20 optionally includes a recess in the planar surface and a device seated in the recess, wherein the device has an upper surface that is coplanar with the planar surface.

In Example 22, the subject matter of any one or more of Examples 20-21 optionally include a contact pillar that emerges from the planar surface, wherein the contact pillar is partially embedded in the first ILD material; a filled via that communicates through the planar surface; a bond pad disposed upon the planar surface in physical and electrical contact with the filled via; and a recess in the planar surface and a device seated in the recess, wherein the device has an upper surface that is coplanar with the planar surface.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductor package, comprising:
   a first interlayer dielectric (ILD) material including an upper surface;
   at least one first trace disposed within the ILD material, wherein the at least one first trace is in electrical contact with a second trace, and wherein the first ILD material contacts the at least one and second trace;
   wherein the first ILD material upper surface includes raster striations.

2. The semiconductor package of claim 1, further including a contact pillar that emerges from the upper surface, wherein the contact pillar is partially embedded in the first ILD material, and wherein the contact pillar contacts one of the at least one trace.

3. The semiconductor package of claim 1, further including:
   a first contact pad disposed on and in electrical contact with one of the least one trace;
   a via disposed in a contact corridor that opens from the upper surface, wherein the via contacts the first contact pad; and
   a contact pad that contacts the via, and wherein the contact pad also is seated on the upper surface.

4. The semiconductor package of claim 1, further including:
   a recess in the upper surface, wherein the recess includes raster striations.

5. The semiconductor package of claim 1, further including:
   a recess in the upper surface, wherein the recess includes raster striations; and
   a device seated in the recess.

6. The semiconductor package of claim 1, further including:
   a recess in the upper surface, wherein the recess includes raster striations; and
   a memory chip seated in the recess.

7. The semiconductor package of claim 1, further including:
   a recess in the upper surface, wherein the recess includes raster striations; and
   a baseband device seated in the recess.

8. The semiconductor package of claim 1, further including:
   a recess in the upper surface, wherein the recess includes raster striations; and
   a transceiver seated in the recess.

9. The semiconductor package of claim 1, further including:
   a recess in the upper surface, wherein the recess includes raster striations; and
   a memory-controller hub seated in the recess.

10. The semiconductor package of claim 1, further including:
    a recess in the upper surface, wherein the recess includes raster striations; and
    a device seated in the recess, wherein the device has an upper surface that is at effectively the same Z-height as the ILD upper surface.

11. The semiconductor package of claim 1, further including:
    a board disposed below the at least one first trace, wherein the board includes an array selected from a land-grid array and a ball-grid array for mounting the semiconductor package.

12. A semiconductor package structure, comprising:
    at least one trace disposed within a first interlayer dielectric (ILD) material, wherein the at least one trace is in electrical contact with a second trace, and wherein the first ILD material contacts the at least one and second trace;
    wherein the first ILD material includes a planar surface that exhibits raster confocal beam decomposition of the first ILD material at the planar surface.

13. The semiconductor package structure of claim 12, further including a filled via that communicates through the planar surface; and
    a bond pad disposed upon the planar surface in physical and electrical contact with the filled via.

14. The semiconductor package structure of claim 12, further including a contact pillar that emerges from the planar surface, wherein the contact pillar is partially embedded in the first ILD material.

15. The semiconductor package structure of claim 12, further including a recess in the planar surface and a device seated in the recess, wherein the device has an upper surface that is coplanar with the planar surface.

16. The semiconductor package structure of claim 12, further including a recess in the planar surface and a device seated in the recess, wherein the device is selected from an active device and a passive device.

17. The semiconductor package structure of claim 12, further including:
    a contact pillar that emerges from the planar surface, wherein the contact pillar is partially embedded in the first ILD material;
    a filled via that communicates through the planar surface;
    a bond pad disposed upon the planar surface in physical and electrical contact with the filled via; and
    a recess in the planar surface and a device seated in the recess, wherein the device has an upper surface that is coplanar with the planar surface.

18. The semiconductor package structure of claim 12, further including a trench in the first ILD material that opens the upper surface, wherein the trench is filled with a trace, and wherein the trace makes physical and electrical contact with the first bond pad and at least one other bond pad.

19. The semiconductor package of claim 12, further including:
    a filled via that communicates through the planar surface;
    a bond pad disposed upon the planar surface in physical and electrical contact with the filled via; and
    a semiconductor die disposed on the planar surface and in electrical contact with the bond pad; and
    a board disposed below the first trace, wherein the first ILD material and first trace are part of a semiconductor die package, and wherein the board includes an array selected from a land-grid array and a ball-grid array for mounting the semiconductor die package.

20. A computing system, comprising:
a semiconductor die disposed on a planar surface of a first interlayer dielectric (ILD) material;
at least one trace dispose within the first ILD material, wherein the at least one trace is in electrical contact with a second trace, and wherein the first ILD material contacts the at least one and second trace;
wherein the first ILD material planar surface exhibits raster confocal beam decomposition of the first ILD material at the planar surface;
a filled via that communicates through the planar surface;
a bond pad disposed upon the planar surface in physical and electrical contact with the filled via, wherein the bond pad is part of a land-grid array for the semiconductor die;
a trench in the first ILD material that opens the planar surface, wherein the trench is filled with a trace, and wherein the trace makes physical and electrical contact with the first bond pad and at least one other bond pad; and
wherein the first ILD material is part of a package substrate, and further including a board onto which the package substrate is disposed, wherein the board includes a ball-grid array on one surface and a physical and electrically insulative shell on a surface opposite the ball-grid array.

21. The computing system of claim 20, further including a recess in the planar surface and a device seated in the recess, wherein the device has an upper surface that is coplanar with the planar surface.

22. The computing system of claim 20, further including:
a contact pillar that emerges from the planar surface, wherein the contact pillar is partially embedded in the first ILD material;
a filled via that communicates through the planar surface;
a bond pad disposed upon the planar surface in physical and electrical contact with the filled via; and
a recess in the planar surface and a device seated in the recess, wherein the device has an upper surface that is coplanar with the planar surface.

* * * * *